United States Patent [19]

Takahashi

[11] Patent Number: 4,659,159
[45] Date of Patent: Apr. 21, 1987

[54] COUPLING DEVICE FOR ELECTRIC DEVICES

[75] Inventor: Shigeki Takahashi, Saijo, Japan

[73] Assignee: Matsushita Electric Industrial Co., Ltd., Osaka, Japan

[21] Appl. No.: 706,270

[22] Filed: Feb. 27, 1985

[30] Foreign Application Priority Data

Mar. 2, 1984 [JP] Japan .................................. 59-41107
Jun. 1, 1984 [JP] Japan ............................... 59-113369

[51] Int. Cl.⁴ ........................................... H01R 13/62
[52] U.S. Cl. .............................. 339/75 M; 339/91 R; 339/119 R
[58] Field of Search ...................... 339/36, 37, 38, 40, 339/42, 184, 186, 45 R, 45 M, 46, 75 R, 75 M, 75 MP, 65, 125 R, 126 R, 91 R, 119 R

[56] References Cited

U.S. PATENT DOCUMENTS

| | | | |
|---|---|---|---|
| 3,020,511 | 2/1962 | Raver | 339/65 |
| 3,035,243 | 5/1962 | Bowling | 339/45 M |
| 3,209,301 | 9/1965 | Duffy, Jr. | 339/40 |
| 3,599,167 | 8/1971 | Adrian | 339/42 |
| 3,977,749 | 8/1976 | Langenbach | 339/91 R |
| 4,040,698 | 8/1977 | Ortiz | 339/40 |
| 4,141,616 | 2/1979 | Gottlieb | 339/75 M |
| 4,288,684 | 9/1981 | Katou et al. | 339/36 |

FOREIGN PATENT DOCUMENTS 2402317 4/1979 France .................................. 339/42

*Primary Examiner*—Gil Weidenfeld
*Assistant Examiner*—David L. Pirlot
*Attorney, Agent, or Firm*—Stevens, Davis, Miller & Mosher

[57] ABSTRACT

Disclosed is a coupling device for a connectable electric unit such as, for example, a portable video recorder and a main electric unit having a mounting surface on which the connectable electric unit is to be set and incorporating therein, for example, a television tuner. The coupling device includes an extendable and retractable stopper which is provided to either the main or connectable electric unit in the position in which the connectable unit is mounted on the main unit so that the stopper prevents the coupling between the connectors of both units whenever the connectable unit is set in a posture other than its predetermined posture. The coupling device also includes an unlocking button for retracting the stopper only when the connectable unit is mounted on the mounting surface of the main electric unit in its predetermined or specified direction. With this arrangement, the connectors are surely connected together and therefore, can be prevented from being broken or damaged.

5 Claims, 21 Drawing Figures

COUPLING DEVICE FOR ELECTRIC DEVICES

BACKGROUND OF THE INVENTION

The present invention relates to a coupling device for two electric devices which can be used where a connectable unit such as, for example, a portable deck, is separably coupled to a main unit having a mounting surface on which the connectable unit, is mounted and incorporating therein, for example, a television tuner.

Electric devices in one set such as, for example, a portable VTR and a main electric unit having a mounting base on which the portable VTR is placed and mounted, are used independently or in combination. Generally, the portable VTR is solely used outdoors, but is used with the main electric device in combination, being mounted on the mounting base of the main electric unit incorporated therein with a television tuner and a.c. power source device to which it is electrically connected.

A portable VTR and a main electric unit having a mounting base therefor which have been conventionally used are shown in FIG. 1, as one example.

In FIG. 1, a reference numeral 1 denotes the main electric unit incorporated therein with a television tuner, a.c. power source device, etc. A main electric unit 1 has on its top a mounting surface 1a on which a portable VTR 2 is mounted, and has a pair of guide frames 1b at both sides of the mounting surface 1a. The coupling of both units is made such that the portable VTR 2 is placed on the mounting surface 1a and then is slid thereon in a direction indicated by an arrow, thereby it is securely coupled to the main electric device 1. When both are coupled together in this way, a connector 3 provided on the rear front face side of the main electric device 1 and a connector 4 provided on the rear side of the VTR 2 are coupled together for electrical connection between them.

In the above-mentioned arrangement, however, there is a possible risk of mounting the portable VTR 2 to the mounting surface 1a of the main electric unit 1, obliquely downward or in unpreferable directions, as shown in FIG. 2, causing male and female pins of the connectors 3, 4 to be obliquely engaged together. As a result, the connectors 3, 4 are sometimes broken.

SUMMARY OF THE INVENTION

The main object of the present invention is to eliminate the above-mentioned disadvantage experienced by the conventional disconnectable type electric units, connectable unit and main electric unit.

The specific object of the present invention it to provide a coupling device for disconnectably coupling a connectable unit such as, for example, a portable video recorder unit, with a main electric unit, which inhibits the coupling and uncoupling between the connectors of both units unless the connectable unit is slid on the main electric unit in a predetermined direction to avoid exerting an unpreferable load to the connectors which are thereby protected from being broken.

According to the present invention, there is provided a coupling unit for electric devices, connectable unit and main electric unit, the connectable unit having, in its one end part, a first connector and the main electric unit having a mounting surface onto which the connectable unit can be set and a second connector provided in one end part of the mounting surface and connectable with the above-mentioned first connector, wherein a retractable stopper is provided to either one or both connectable unit and main electric unit, for inhibiting the coupling between the connectable unit and the main electric unit, in a position corresponding to the position where the connectable unit is to be set, and a release button which enables the stopper to retract only when the connectable unit is moved in a predetermined direction with respect to the main electric unit.

DESCRIPTION OF THE PREFERRED EMBODIMENTS

A coupling device in to a first embodiment form of the present invention for coupling a portable video recording unit to a main electric unit including a television tuner will now be described with reference to FIGS. 3 to 4C.

Figure 1:
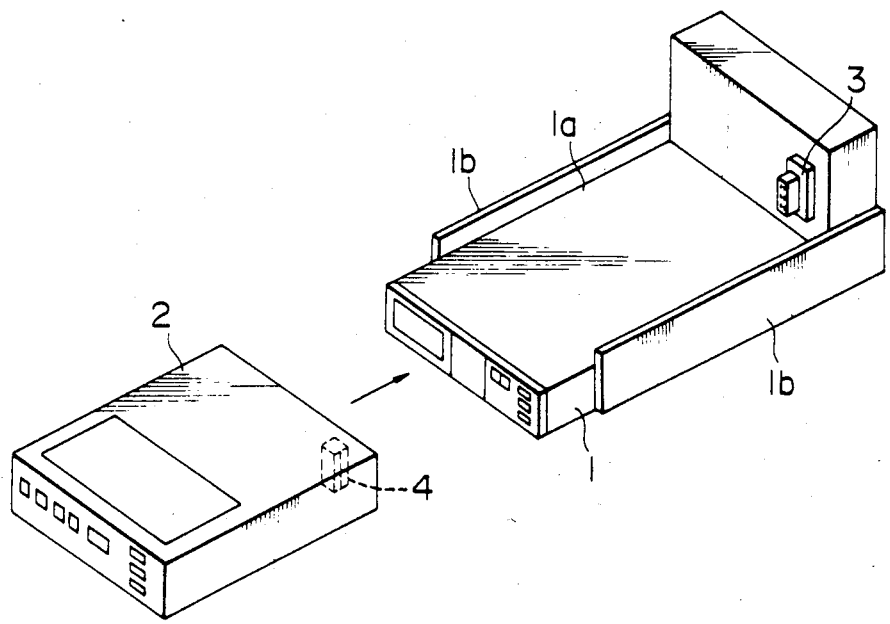
FIG. 1 is a perspective view of a prior art coupling device for electric units.
Figure 2:
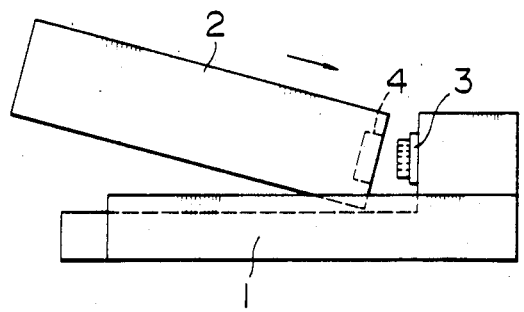
FIG. 2 is a side view thereof.
Figure 3:
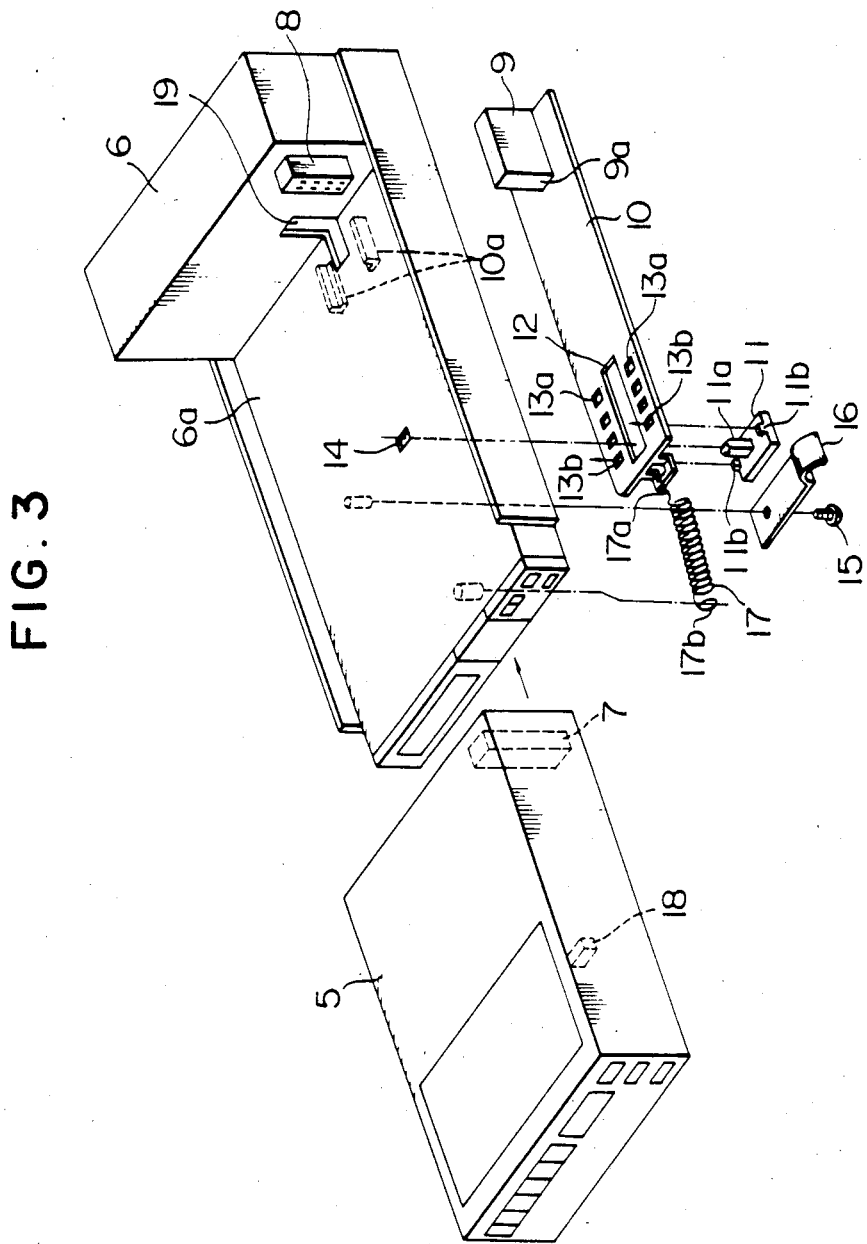
FIG. 3 is a perspective view of a coupling device for electric units in a first embodiment of the present invention.

In this coupling device, an shown in FIG. 3, when a portable video recording unit 5 is slide in its horizontal attitude on a main electric unit 6, including a television tuner, from the front side to the rear side (the direction indicated by an arrow), a connector 7 of the video recording unit 5 is disconnectably coupled to a connector 8 of the main electric unit 6.

A slide stopper 9 is mounted in the vicinity of the connector 8 of the main unit 6. This slide stopper 9 is inserted into a bore 19 provided in a mounting surface 6a of the main unit 6, and is mounted in such a manner that a slide plate 10 fixed to the slide stopper 9 is fitted into guide ribs 10a so as to permit this stopper to slide in a direction (a direction directed from the front side toward the back side) in which the portable unit 5 is set on the main unit 6. The slide plate 10 fixed with the slide stopper 9 is formed with a through bore 12 for permitting a head portion 11a of an unlocking or releasing button 11 to pass therethrough as well as through bores 13a and 13b for permitting locking portions 11b therethrough. The distance range in which the bores 12, 13, 13b extend is made equal to a distance between the position of the rear surface of the portable unit 5 where the connectors 7 and 8 have been completely coupled together, as shown in FIG. 4A, and the position of the rear surface of the portable unit 5 where the connectors 7 and 8 have been completely disconnected from each other and as well where the slide stopper abutted against the rear end of the mounting surface 6a of the main unit 6 inhibits the rear surface of the portable unit from making contact with the connector 8 of the main housing, as shown in FIG. 4C.

The unlocking button 11 is inserted from below, through the bore 12 of the slide plate 10 and a bore 14 formed in the main unit, and is urged upwards from below by means of a spring 16 having its one end fixed to the underside of the main unit 6 by, for example, a screw thereby, the unlocking button 11 is vertically movable. To the slide plate 10 is attached one end 17a of a spring 17, the other end of which is fixed to the underside of the main unit 6, whereby the slide stopper 9 is pulled in the forward direction.

Figure 4A:
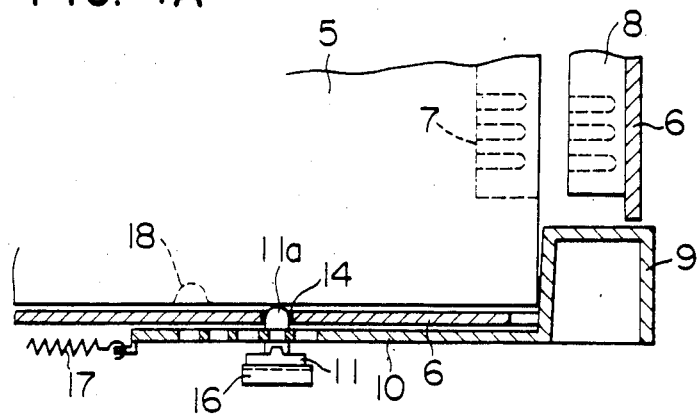
FIGS. 4A, 4B and 4C are side sectional views showing the coupling steps of both electric devices with the use of the coupling device.

With this arrangement, when, as shown in FIG. 4A, the portable unit 5 is positioned in its horizontal attitude and is set on the main unit 6 from a specified direction and slid backwards, the unlocking button 11 is depressed by the underside of the portable unit 5 and is disengaged from the bore 13a of the slide plate 10, resulting in unlocking the slide plate 10. When the portable unit 5 is pushed to the main unit 6 in this state, the rear face of the portable unit 5 abuts against the front wall 9a of the slide stopper 9. Thus, the slide stopper 9 is slid backwards overcoming the urging force of the spring 17 together with the portable unit 5, thereby the connectors 7 and 8 of the portable unit 5 and main unit 6 are surely coupled to each other, with the connector being held in the specified horizontal posture.

Figure 4B:
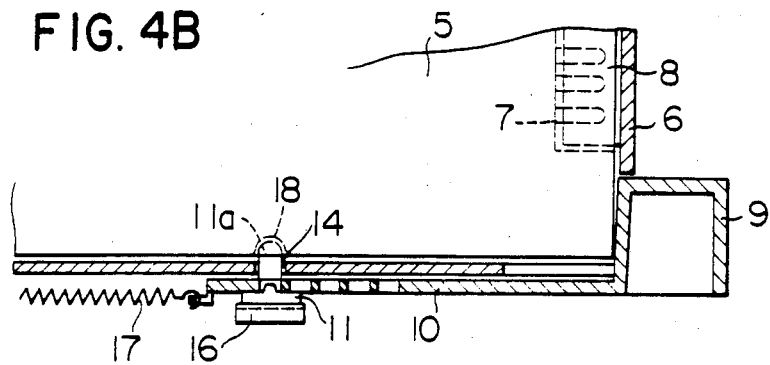

When the connectors 7 and 8 have been completely coupled together, as shown in FIG. 4B the locking portions 11b of the unlocking button 11 are fitted into the bores 13b of the slide plate 10, and therefore, the head portion 11a of the same is moved upwards to enter a recess portion 18 provided in the underside of the deck 5. Thus, in this state, the slide plate 10 fixed with the slide stopper 9 is locked again. As a result, the pulling force of the spring 17 is ineffective to the portable unit 5 and thus the coupling between both connectors 7 and 8 becomes secure.

Figure 4C:
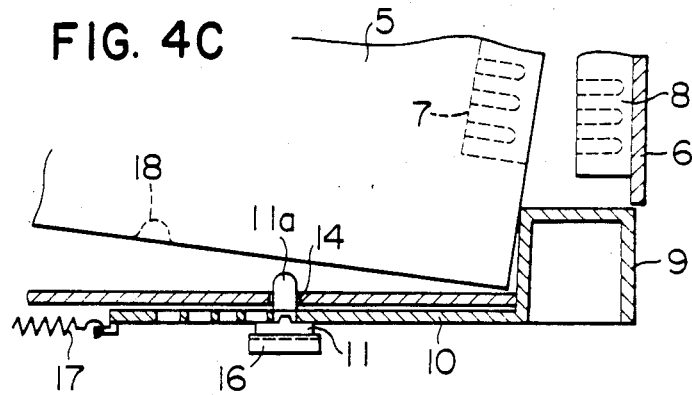

However, when, as shown in FIG. 4C, an attempt is made to mount the portable unit 5 in directions other than the specified horizontal direction, such as, for example, a direction obliquely downward, onto the mounting surface of the main unit 6, a gap is created between the underside of the portable unit 5 and the main unit 6, resulting in that the unlocking button 11 fails to be depressed. Thus, the locking portion 11b of the unlocking button 11 is held, fitted in the bore 13a of the slide plate 10 fixed with the slide stopper 9. That is, the slide plate 10 is held locked, so that the slide stopper 9 does not slide backwards. In this state, therefore, due to no backward slide of the slide stopper 9 even when the portable unit 5 is pushed backwards, it is impossible to couple the connectors 7 and 8 together. Accordingly, the portable unit 5 can not be coupled to the main unit 6 when it is mounted in a direction other than the abovementioned specified horizontal direction. According to this first embodiment of the present invention, therefore, it is possible to disconnectably couple the connectors together without causing any damage thereto.

The coupling device according to the present invention is not limited to the arrangement described above. That is to say, the coupling device may also be arranged such that the slide stopper 9 is allowed to slide vertically. Further, if a locking means is provided to the connectors 7, 8, the slide plate 10 fixed to the slide stopper 9 may have only one pair of locking bores and a slit for sliding the unlocking button 11.

Figure 5:
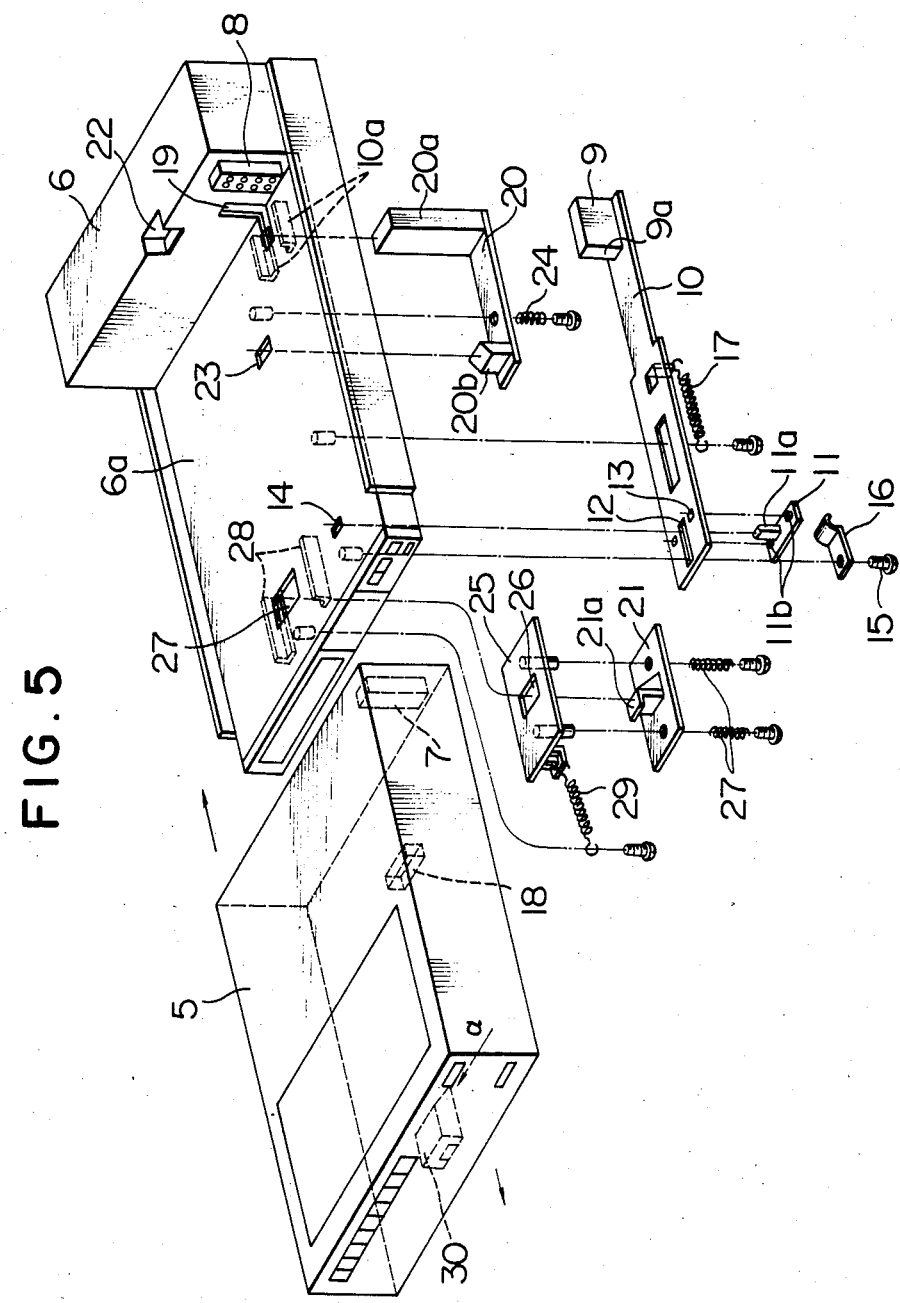
FIG. 5 is a perspective view of a coupling device for electric units in a second embodiment of the present invention.

In FIG. 5, a second embodiment of the present invention is shown.

In this embodiment, a slide stopper 9 and a locking member 20 are provided separately from each other, and a left checking member 21 for preventing the front portion of the portable unit 5 from being upwardly separated from the main device 6 is provided.

The slide stopper 9 is disposed such that its stopper portion protrudes from a window 19 of the main electric unit 6, and a slide plate 10 fixed with the stopper 9 is supported by guide ribs 10a in such a manner that it is slidable in the back-and-forth direction. The slide plate 10 is also forwardly urged by the spring 17. Further, the head portion 11a of the unlocking button 11 is inserted through bores 12, 14, protruding from the top surface of the main device 6. At the same time, the locking portions 11b are fitted into the bores 13, respectively. The unlocking button 11 is upwardly urged by means of a spring 16.

The locking member 20 is disposed such that its push button section 20a protrudes from a window 22 in the main unit 6 and such that its locking portion 20b protrudes from the top surface of the main unit 6 through a bore 23. The locking member 20 is upwardly urged by means of a spring 24, being vertically movable.

Further, the lift checking member 21 is mounted such that its checking portion 21a is inserted through a bore 26 of a support plate 25 and it is supported in such a manner that it is upwardly urged by means of a spring 27. Further, the checking portion 21a of the lift checking member 21 inserted, from below, through a bore 27 of the main device 6, protruding from the top surface of the same. Further, the support plate 25 is held by guide ribs 28 so as to be slidable in the forward or backward direction. This support plate 25 is forwardly urged by means of a spring 29.

Figure 6:
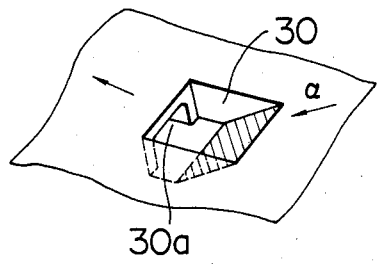
FIG. 6 is an enlarged perspective view of a main part thereof.

The underside of the connectable electric unit 5 is formed with a recess portion 18 to be engaged with the locking portion 20b of the locking member 20, as well as a recess portion 30 to be engaged with the checking portion 21a of the lift checking portion 21. This recess portion 30 is formed, as shown in FIG. 6, with an engaging portion 30a which is intended to prevent the connectable unit 5 from lifting off the main electric unit 6, owing to the engagement with an L-shaped tip end portion of the checking portion 21a.

With the above-mentioned arrangement, the connectable electric unit 5 is coupled to the main electric unit 6 as follows. First of all, the connectable electric unit 5 is placed on the top surface of the main device 6. Only when connectable unit 5 is surely placed without being set on the main unit 6 obliquely downward, the head portion 11a of the unlocking button 11 is depressed by the underside of the connectable electric unit 5. Thus, the locking of the slide stopper 9 is released and, in this state, the connectable unit 5 is backwardly pushed, whereby the front wall 9a of the slide stopper 9 is pushed backward overcoming the pulling force of the spring 17. Consequently, the connectors 7 and 8 of the two units 5, 6 are coupled together. When the connectable unit 5 is set obliquely downward onto the main device 6, the head portion 11a is not depressed, resulting in that the slide stopper 9 is held locked. Thus, the connectors cannot be coupled together if connectable unit 5 is set on the main unit 7 in a posture other than the specified posture.

When the connectable electric unit 5 is correctly coupled to the main electric unit 6, the locking portion 20b of the locking member 20 is brought into engagement with the recess portion 18 of the connectable unit 5, to prevent the same from being forwardly moved. When the connectable unit 5 is pressed to the back side of the main device 6, the checking portion 21a of the lift checking member 21 is brought into engagement with the engaging portion 30a of the recess portion 30 of the connectable unit 5, resulting in that the connectable unit 5 is prevented from being lifted from the main device 6. Thus, the connectable unit 5 is held correctly mounted on and coupled to the main unit 6.

Next, when the connectable unit 5 is dismounted, the push button section 20a of the locking member 20 is manually depressed by an operator. Then, the locking member 20 is downwardly moved so that its locking portion 20b is disengaged from the recess portion 18 of the connectable unit 5. As a result, the connectable unit 5 is unlocked and, therefore, the connectable unit 5 is pushed forwards by the front wall 9a of the slide stopper 9 due to the pulling force of the spring 17. Thus, the coupling between the connectors 7 and 8 is made ineffective. At the same time, as the connectable unit 5 is moved forwards, the engaging portion 30a of the recess portion 30 is disengaged from the L-shaped tip end portion 21a of the lift checking member 21. Thus, the connectable unit 5 is dismounted from the main unit 6.

In this way, according to the second embodiment of the present invention, it is possible to disconnectably couple the connectable unit 5 from the main electric unit 6 in a short time. However, this can be made only when the connectable unit is correctly set on the main unit in order to couple both connectors. Thus, the connectors can be prevented from being damaged or broken.

Next, a coupling device according to a third embodiment of the present invention will be described with reference to FIGS. 7 to 11.

The coupling device according to this embodiment comprises a main electric unit 6, unit 5 which can be mounted to the main unit 6 by sliding the same rearwardly and which can be dismounted therefrom by sliding the same forwardly, a connector provided on the main unit, and a connector provided on the connectable unit and arranged to be connected with the connector of the main unit. In this coupling device, a recessed portion or depression is formed in either one of the main unit or connectable unit. This depression is provided, on its front wall, with a projection facing rearward. The other one of both units is provided with a stopper which is extendable and retractable and is also movable in the back-and-forth direction. This stopper is provided with a locking piece which is L-shaped in vertical section and which is fitted into the above-mentioned depression to be engaged with the projection provided on the front wall of the depression, as well as a withdrawal or disengagement preventing piece which is extendable and retractable between the locking piece and a back wall of the depression, whereby, when the stopper has been moved forwards, the disengagement preventing piece can be retracted, or is retreated below the upper surface of the main unit 6.

Figure 7:
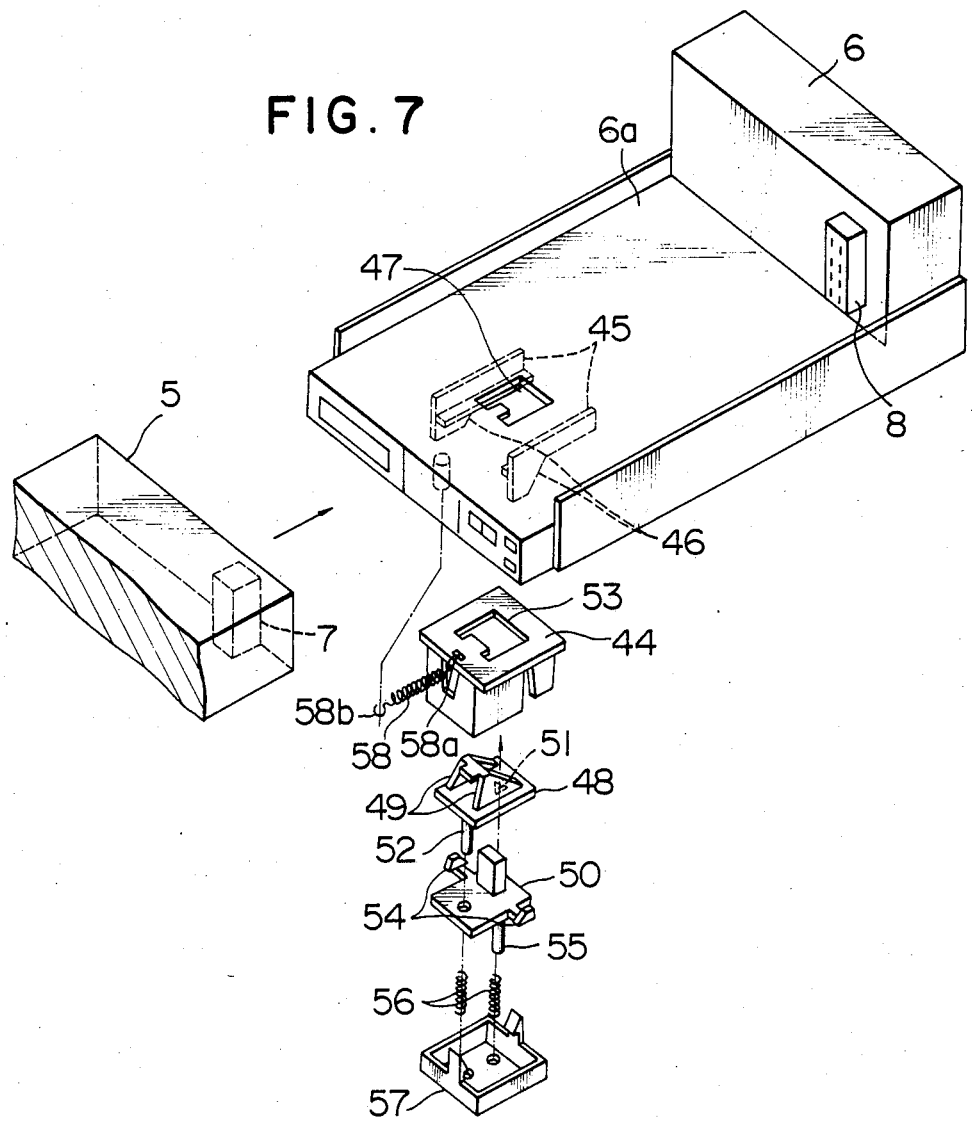
FIG. 7 is a perspective view of a coupling device for electric units in a third embodiment of the present invention.
Figure 8:
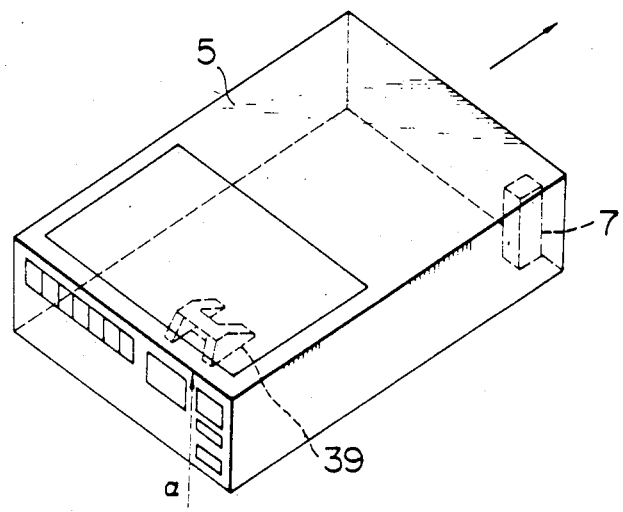
FIG. 8 is a perspective view of an auxiliary electric device used in connection with the coupling device of the third embodiment.
Figure 9:
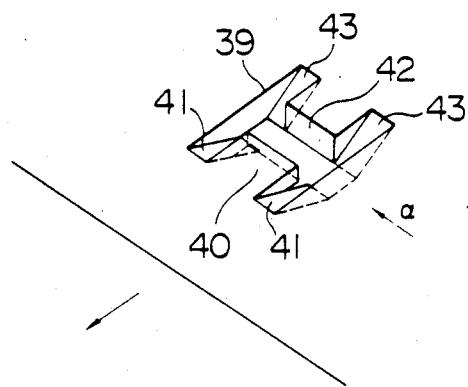
FIG. 9 is a perspective view of a main part of the same.

In this coupling device as shown in FIGS. 7 to 9, the connectable electric unit 5 such as, for example, a portable unit is arranged to slide on the main electric device 6 having a television tuner incorporated therein from the front side toward the back side thereof (the direction indicated by an arrow), with the connectable unit being positioned in its horizontal posture, thereby the connector 7 provided on the connectable unit is disconnectably coupled to the connector 8 provided on the main unit. A recessed portion 39 is formed in the underside of the connectable unit 5. On the front wall of this recessed portion 39 there is provided the projection 40 extending backwards, on both sides of which are provided inclined surfaces 41. At the rear wall of the recessed portion 39 there is provided a surface 42 vertical with respect to the bottom surface of the connectable unit 5, on both side ends of which there are provided inclined surfaces 43, respectively.

Onto the main unit 6, a stopper case 44 is mounted by way of guide ribs 45 so that this stopper case 44 is slidable in a direction in which the connectable unit 5 is mounted, i.e., a direction directed from the front side toward the back side of the main unit 6. At the front portions of these guide ribs 45 are provided ribs inclined in the direction in which the stopper case 44 can be slid. Further, a stopper 48 is mounted so that it is inserted through a bore 47 of the main unit 6 from below the stopper case 44. The stopper 48 is fitted into the recessed portion 39 provided in the connectable unit 5 and is engaged with the projection 40 provided on the front wall of the recessed portion 39. Its vertical section is shaped like a letter L. Further, the stopper 48 is also provided, on both sides of its L-shaped portion, with inclined ribs 49 to be engaged with the inclined surfaces 41 and 43 provided in the recessed portion 39 of the connectable unit 5. In the rear portion of the stopper 48, a through bore 51 is provided, which through bore 51 is engaged with the disengagement preventing member piece 50. Further, the stopper 48 is also provided, at its bottom, with a guide pin 52. The disengagement preventing piece 50 is fitted, from below, into a bore 51 provided in the stopper 48. The disengagement preventing piece 50 is fitted between the back of the stopper 48 engaged with the projection 40 formed in the connectable unit 5 and the back wall 42 provided in the same. The disengagement preventing piece 50 is provided, on its right and left sides, with inclined ribs 54 which are engaged with the inclined ribs 46 provided on the main electric unit 6, respectively. Further, the disengagement preventing piece 50 is provided, at its bottom surface, with a guide pin 55.

Coil springs 56 are fitted, from below, onto the guide pins 52, 55 provided on the stopper 48 and the disengagement preventing piece 50, respectively. A case cover 57 is mounted, from below, onto the stopper case 44 so that the stopper 48 and the disengagement preventing piece 50 may be vertically movable. The stopper 48 and the disengagement preventing piece 50 are arranged such that when the stopper 48 is depressed downwards, the latter piece 50 is moved downwards together with the former 48; and when the disengagement preventing piece 50 is depressed downwards, the stopper 48 is not moved at all but the piece 50 alone is moved. The stopper case 44 is attached with one end 58a of a spring 58, the other end 58b of which is fixed to the main unit 6, thereby the stopper case 44 is held forwardly pulled.

Figure 10A:
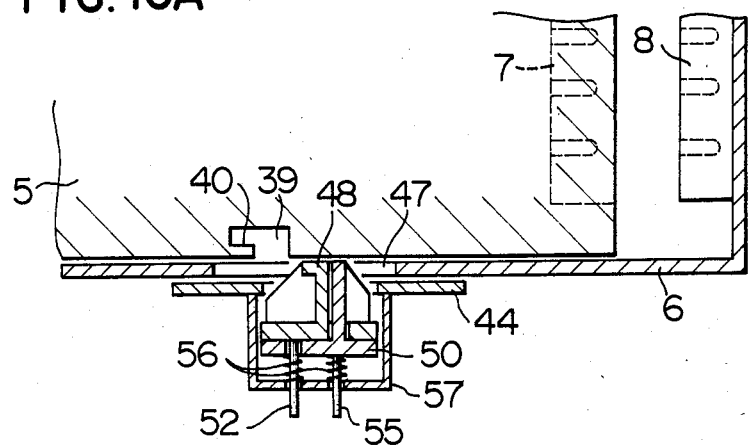
FIGS. 10A, 10B and 10C and FIGS. 11A, 11B and 11C are sectional views showing the coupling steps of both electric units with the use of the coupling device of the third embodiment of the present invention.
Figure 10B:
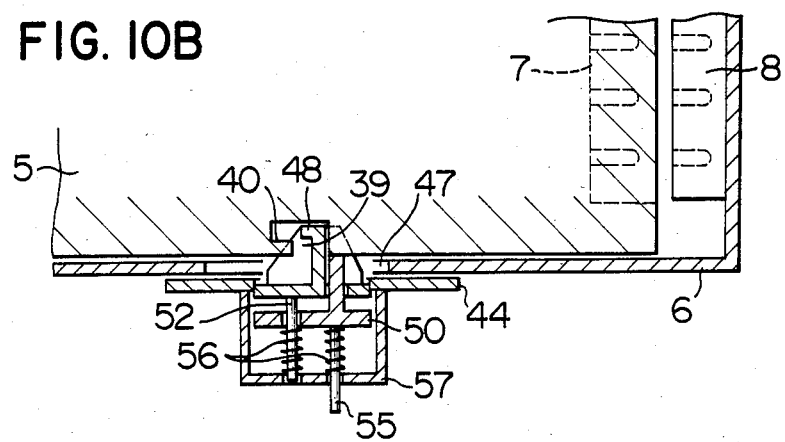
Figure 10C:
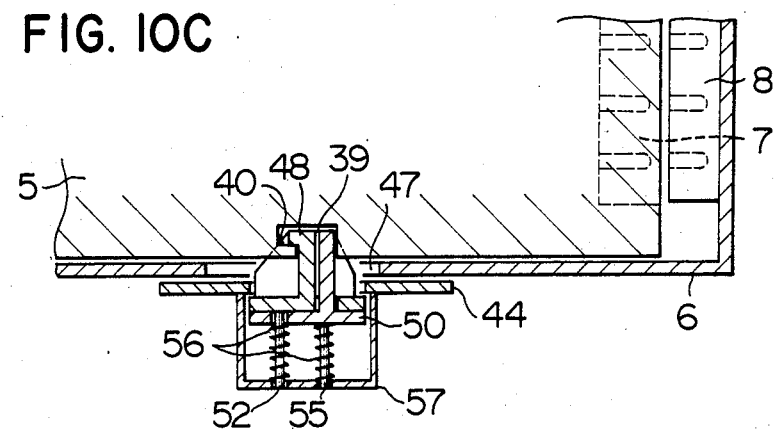
Figure 11A:
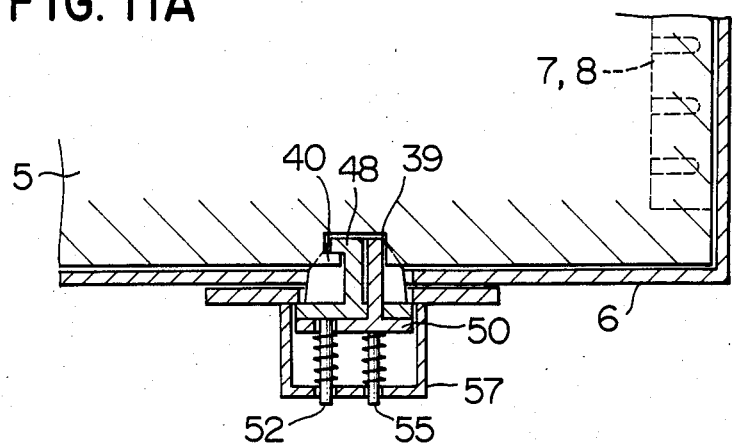

In operation, as shown in FIG. 10A, when the connectable unit 5 is directed in a specified direction while being positioned in its horizontal position and placed on the main unit 6, the stopper 48 and the disengagement preventing piece 50 are pushed downwards. Next, as shown in FIG. 10B, when, in this state, the connectable unit 5 is slid backwards, the stopper 48 is fitted into the recessed portion 39 provided in the bottom surface of the connectable unit 5, and is slid upwards by the action of the coil spring 56. Next, as shown in FIG. 10C, when the connectable unit 5 is further slid backwards, the stopper 48 is engaged with the rearwardly extending projection 40 provided on the front wall of the recessed portion 39, resulting in that the unit 5 is prevented from being lifted from the main unit 6. Further, the disengagement preventing piece 50 is fitted between the back wall of the stopper 48 and the back wall 42 of the recessed portion 39 of the connectable unit 5, resulting in that the engagement of the connectable unit 5 with the stopper 48 is reliably effected. Thus, the respective connectors 7 and 8 of the connectable unit 5 and the main unit 6 are correctly coupled together, held in a specified horizontal posture.

Where the connectable unit 5 is coupled to the main unit 6 as shown in FIG. 11A, since the projection 40 of the recessed portion 39 provided in the connectable unit 5 is engaged with the stopper 48, it is impossible to lift the connectable unit 5 from the main unit 6.

Figure 11B:
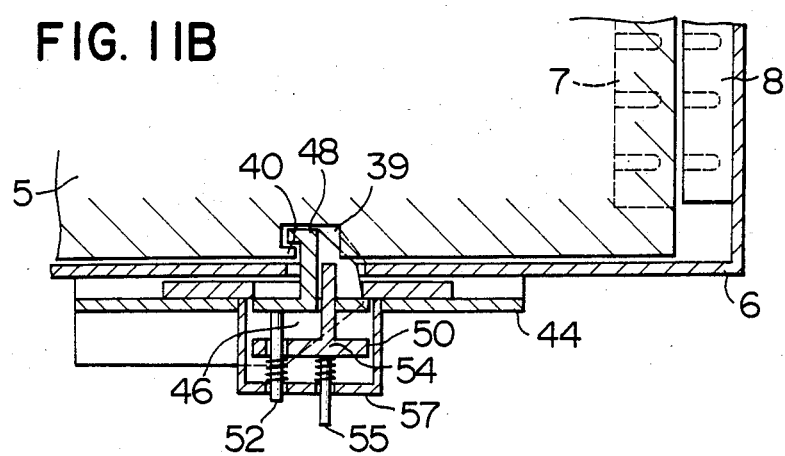
Figure 11C:
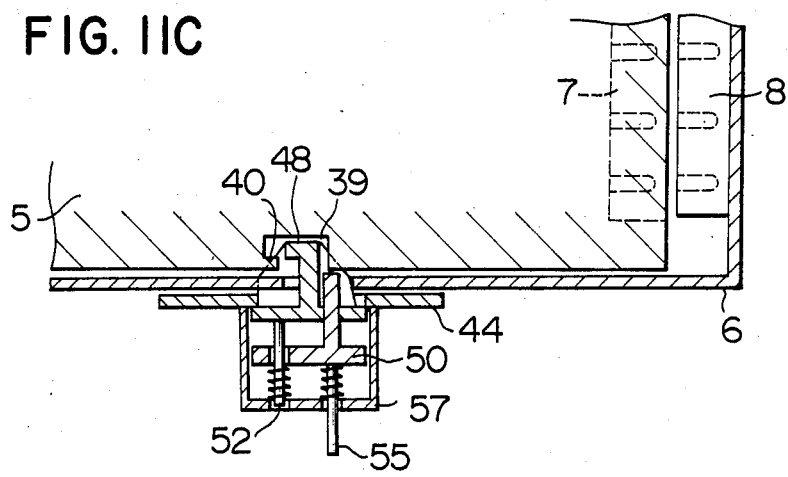

On the other hand, when the connectable unit 5 is dismounted from the main unit 6, as shown in FIG. 11B forward sliding of the auxiliary device 5 held in its horizontal posture would cause the inclined ribs 54 provided on the disengagement preventing piece 50 to be guided by the inclined ribs 46 provided on the main device 6, resulting in that the disengagement preventing piece 50 is depressed downwards. Further forward sliding of the connectable unit 5 would permit the stopper 48 to rise in the bore 47 of the main device 6 so that the stopper 48 is disengaged from the projection 40 as shown in FIG. 11C. More further forward sliding of the connectable unit 5 would cause the inclined ribs 49 of the stopper 48 to be pushed by the inclined surfaces 43 provided in the connectable unit 5. Thus, the stopper 48 is pushed downwards, whereby the unit 5 can be dismounted from the main unit 6.

Where an attempt is made to dismount the unit 5 in such a condition the connectors 7 and 8 are coupled to each other, the engagement of the stopper 48 with the projection 40 of the recessed portion 39 provided in the connectable unit 5 makes it impossible to lift the connectable unit 5 from the main unit 6. That is to say, the connectable unit 5 can not slide on the main unit 6 unless in a specified horizontal direction. For this reason, no extraordinary load is applied to the connectors 7 and 8. That is, these connectors can be disconnectably coupled to each other without being broken or damaged.

Having above described the third embodiment of the present invention, the arrangement of the coupling device is not limited to those which have been described hereinbefore. A coupling device wherein the stopper is added to the connectable electric unit 5 can be also included within the scope of the present invention.

Further, the coupling device of the present invention is also applicable to a coupler for coupling a small-sized wireless unit and a main electric unit having a power amplifier incorporated therein.

Figure 12:
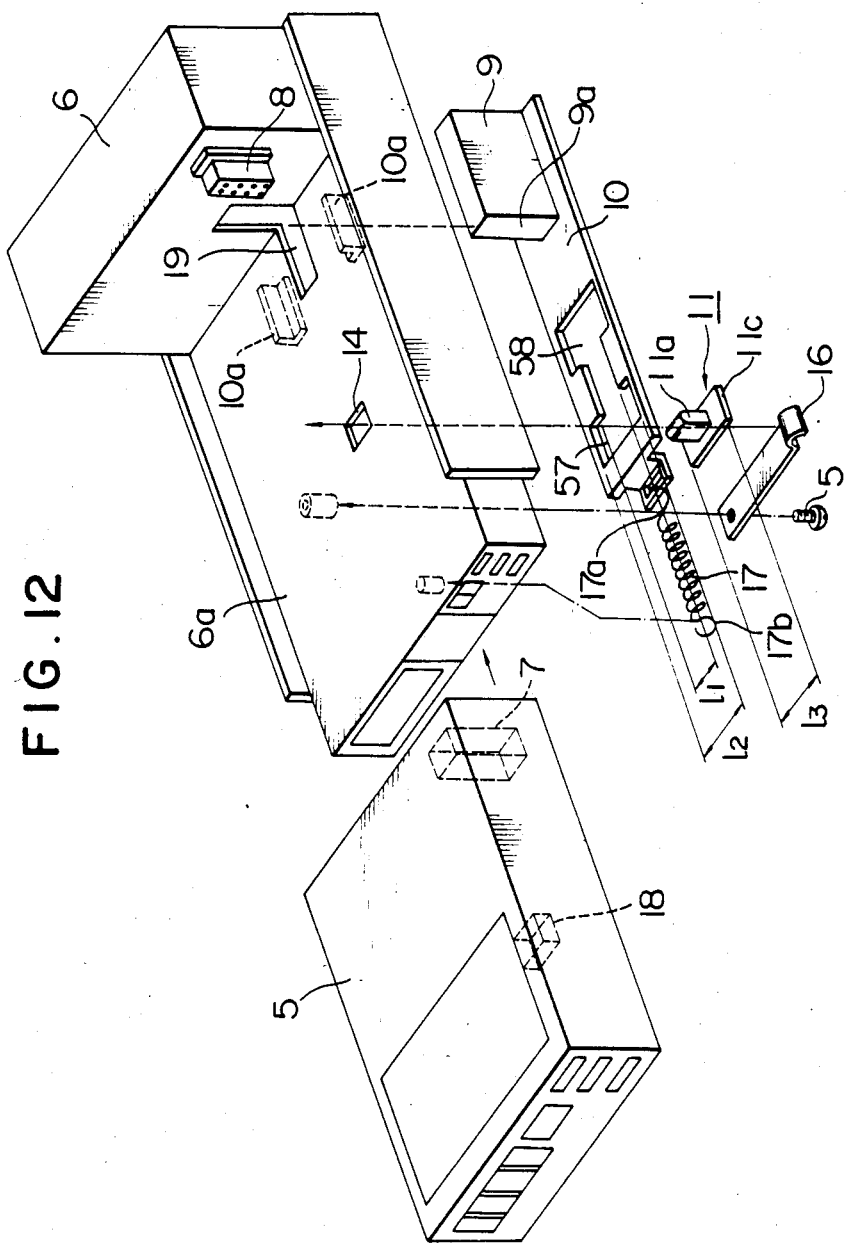
FIG. 12 is an exploded perspective view of a coupling device for electric units in a fourth embodiment of the present invention.

A coupling device according to a fourth embodiment of the present invention is shown in FIG. 12.

The coupling device of this embodiment is arranged such that the connector 7 of the portable VTR unit 5 is disconnectably coupled to the connector 8 of the main electric unit 6 having a television tuner, etc. incorporated therein, by being slid thereon from the front side toward the back side (the direction indicated by the arrow) with the unit 5 being held in its horizontal posture, as in the prior coupling device. In this embodiment, the stopper 9 is mounted in the vicinity of the connector 8 of the main device 6. This slide stopper 9 is fixed to the slide plate 10 and this slide plate 10 is mounted on the main unit 6 by way of the guide ribs 10a so that it can be slid in the mounting direction of the VTR 5, i.e., in the backward direction thereof. The stopper 9 can protrude from the sliding surface 6a of the main unit 6 via the through bore 19 provided therein. Further, the slide plate 10 is provided with bores 57 and 58 which have a width 12 greater than the width 13 of a flange portion 11c of the unlocking button 11 and which allow this flange portion 11c to pass and which are spaced from each other at a specified interval. The space between these two bores 57, 58 corresponds to the distance between the position of the front wall 9a of the slide stopper 9, which corresponds to the position of the back surface of the unit 5 when the connectors 7 and 8 have been completely coupled together, and the position of the front wall 9a of the slide stopper 9, which corresponds to the position of the back surface of the unit 5 when both connectors have been completely disconnected from each other. Further, both bores 57 and 58 are communicated with each other through a slit having a width 11 permitting the head portion 11a of the unlocking button 11 to pass through this slit. That is, this width 11 is made greater than the width of the head portion 11a of the unlocking button and made smaller than the width 13 of the flange portion 11c of the unlocking button 11.

The unlocking button 11 is inserted from below, through the slide plate 10 and the through bore 14 of the main unit 6 and is pressed upward by the spring 16 having one end fixed onto the underside of the main unit 6 by means of, for example, a screw so that the unlocking button 11 is vertically movable. One end 17a of the spring 17 is attached to one end portion of the slide plate 10 while the other end 17b thereof is fixed to the main unit 6, so as to pull the slide plate 10 in the forward direction.

Figure 13A:
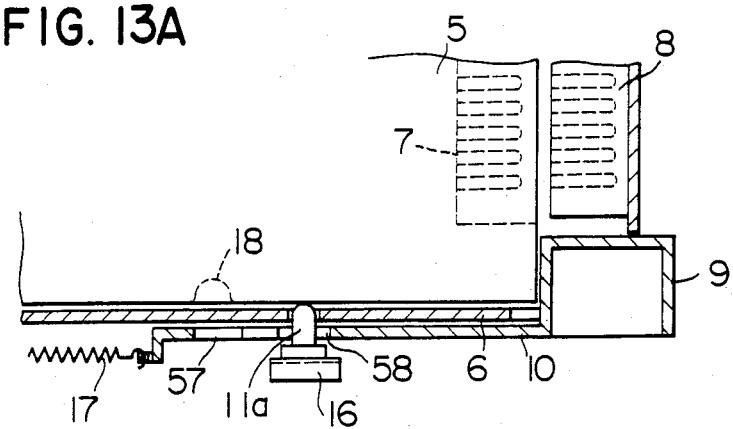
FIGS. 13A, 13B and 13C are side sectional views showing the coupling steps of both electric units with the use of the coupling device of the fourth embodiment.

As shown in FIG. 13A, when the unit 5 is set to the main unit 6 from a specified horizontal direction while being positioned in its horizontal posture on the upper surface of the main unit 6 and then is slid in the backward direction, the unlocking button 11 is pressed downwards, thereby the flange portion 11c thereof is disengaged from the bore 58 of the slide plate 10. Thus, this plate 10 is unlocked.

Figure 13B:
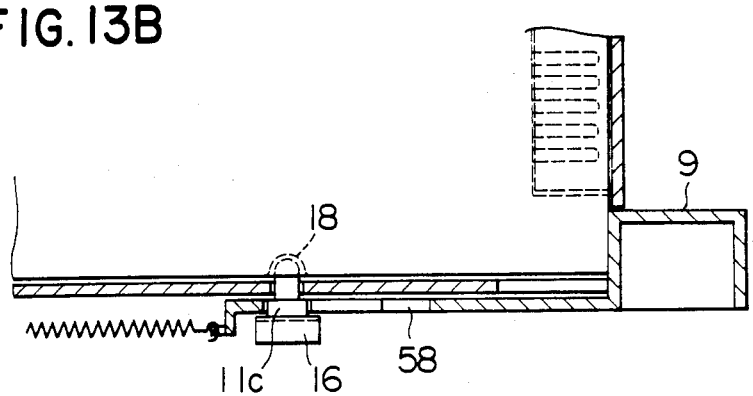
Figure 13C:
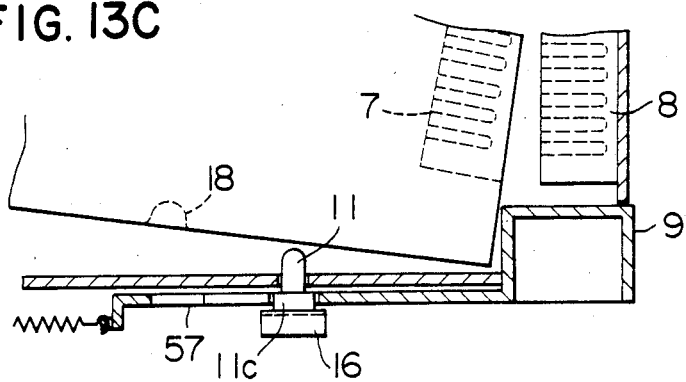

When, in this state, the unit 5 is pushed to the back side of the main unit 6, its back surface is abutted against the front wall of the deck stopper 9, whereby the slide stopper 9 is backwardly slid together with the unit 5. Thus, the connectors 7 and 8 of the unit 5 and the main unit 6 are surely coupled to each other, both units being held in their horizontal posture. As shown in FIG. 13B, when the connectors 7 and 8 have completely been coupled together, the flange portion 11c of the unlocking button 11 is inserted into the bore 57 of the slide plate 10 and is moved upwards so as to enter into the recessed portion 18 provided in the bottom surface of the deck 5. Then, the slide plate 10 is locked again in this state, resulting that the forwardly pulling force of the spring 17 is ineffective to the unit 5. Thus, the connectors 7 and 8 will not be disconnected, accidentally. However, as shown in FIG. 13C, when at attempt is made to mount the unit 5 directions other than the specified horizontal direction that is, for example, in a direction obliquely on the upper surface of the main unit 6, a gap or space is created between the underside of the unit 5 and the upper surface of the main unit 6, resulting in that the unlocking button 11 is not depressed downwards. For this reason, the flange portion 11c of the unlocking button 11 is held fitted in the bore 58 of the slide plate 10, i.e., the slide plate 10 is held locked. As a consequence, the slide plate 10 is slid backwards. In this state, therefore, even when the unit 5 is pushed backwards, it is impossible to couple the connectors 7 and 8 together. That is, since the unit 5 can not be coupled to the main unit 6 unless it is mounted from the specified horizontal direction, both can be coupled to each other without the connectors being broken or damaged.

What is claimed is:

1. A coupling device for electric devices, comprising: a connectable electric unit having a first connector at one end thereof, a main electric unit having a mounting surface on which said connectable unit is to be set, and a second connector provided at one end portion of said mounting surface and adapted to be coupled with said first connector, a stopper projecting from said main electronic unit and movable between a first position where said stopper inhibits said first connector from being coupled with said second connector and a second position where said stopper retracts into said main electrical unit so as to allow the coupling between said first and second connectors, a first means for resiliently urging said stopper toward said first position, a means for locking said stopper at said first position, an unlocking member movable between a third position where said unlocking member projects from said mounting surface and a fourth position where said unlocking member retracts from said mounting surface, a second means for resiliently urging said unlocking member toward said third position, and a means for releasing the locking of said locking means when said unlocking member moves to said fourth position.

2. A coupling device as set forth in claim 1, wherein said stopper is fixed to a slide plate having therein a through-bore through which said unlocking member retractably projects from said mounting surface, and said locking means engages with said slide plate when said unlocking member is in said third position to inhibit said slide plate from sliding, but said locking means disengages from said slide plate when said unlocking member is in said fourth position.

3. A coupling device as set forth in claim 1, wherein said connectable electrical unit has a bottom surface adapted to oppose said mounting surface, said bottom surface having a recess portion therein which allows said unlocking member to project from said mounting surface upon engagement of said first and second connectors.

4. A coupling device as set forth in claim 1, wherein said connectable electrical unit has a bottom surface adapted to oppose said mounting surface, said coupling device further comprising a first locking piece which is movable between a fifth position where said locking piece projects from said mounting surface and a sixth position where said locking piece is retracted for said mounting surface by being pressed by said bottom surface of said connectable electrical unit, a third means for resiliently urging said first locking piece toward said fifth position, a recess portion formed in said bottom surface of said connectable electrical unit and adapted to be engaged with said first locking piece upon coupling between said first and second connectors so as to prevent said connectable electrical unit from sliding on said mounting surface, and a push member for moving said first locking piece toward said sixth position in opposition to a force exerted by said third means for resiliently urging.

5. A coupling device as set forth in claim 1, wherein said connectable electrical unit has a bottom surface adapted to oppose said mounting surface, said coupling device further comprising a lift checking member movable between a seventh position where said lift checking member projects from said mounting surface and an eighth position where said lift checking member is retracted from said mounting surface by being pressed by said bottom surface of said connectable electrical unit, said having a front end formed thereon with a locking portion projecting in parallel with said mounting surface, a fourth means for resiliently urging said lift checking means toward said seventh position, and a recess portion formed in said bottom surface of said connectable electrical unit and adapted to be engaged with said locking portion upon coupling of said first and second connectors so as to inhibit said connectable electrical unit from being removed from said mounting surface.

* * * * *